United States Patent
Conte

(10) Patent No.: US 6,571,187 B1
(45) Date of Patent: May 27, 2003

(54) METHOD FOR CALIBRATING TWO PORT HIGH FREQUENCY MEASUREMENTS

(75) Inventor: Robert A. Conte, Manalapan, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/500,661

(22) Filed: Feb. 9, 2000

(51) Int. Cl.⁷ .................... G01D 18/00; G01D 21/00
(52) U.S. Cl. ............................ 702/85; 324/601
(58) Field of Search ............... 702/70–71, 74–77, 702/106, 112, 191, 195, 196, 85; 324/601, 615

(56) References Cited

U.S. PATENT DOCUMENTS

| | | | | |
|---|---|---|---|---|
| 4,858,160 A | * | 8/1989 | Strid et al. ............. | 364/571.01 |
| 5,159,262 A | * | 10/1992 | Rumbaugh et al. ..... | 324/158 R |
| 5,442,296 A | * | 8/1995 | Schiek et al. ............. | 324/601 |
| 5,578,932 A | * | 11/1996 | Adamian ................... | 324/601 |
| 5,587,934 A | * | 12/1996 | Oldfield et al. ............... | 702/85 |
| 5,661,404 A | * | 8/1997 | Yanagawa et al. ........... | 324/601 |
| 5,666,059 A | * | 9/1997 | Heuermann et al. ........ | 324/601 |
| 5,715,183 A | * | 2/1998 | Grace et al. .................. | 702/85 |
| 5,748,506 A | * | 5/1998 | Bockelman .................. | 702/85 |
| 5,751,153 A | * | 5/1998 | Bockelman ................. | 324/638 |
| 5,784,299 A | * | 7/1998 | Evers et al. .................... | 702/85 |
| 5,793,213 A | * | 8/1998 | Bockelman et al. ........ | 324/601 |
| 5,825,669 A | * | 10/1998 | Oldfield et al. ............... | 702/85 |
| 6,025,709 A | * | 2/2000 | Bradley ................... | 324/158.1 |
| 6,066,953 A | * | 5/2000 | Wadell ........................ | 324/601 |
| 6,147,501 A | * | 11/2000 | Chodora ..................... | 324/601 |
| 6,188,968 B1 | * | 2/2001 | Blackhan ..................... | 702/85 |
| 6,249,128 B1 | * | 6/2001 | Begg ........................... | 324/601 |
| 6,300,775 B1 | * | 10/2001 | Peach et al. ................. | 324/601 |
| 6,347,382 B1 | * | 2/2002 | Nakayama et al. ........... | 714/37 |
| 6,081,125 A1 | * | 6/2002 | Krekels et al. ............. | 324/601 |
| 6,421,624 B1 | * | 7/2002 | Nakayama et al. ......... | 702/117 |

OTHER PUBLICATIONS

Oswald, O. "12–term system–error correction in network analysis", 1985, News from Rhode and Schwarz vol. 25, No. 108 p. 26–27.*

* cited by examiner

Primary Examiner—John Barlow
Assistant Examiner—Demetrius Pretlow
(74) Attorney, Agent, or Firm—Ryan, Mason & Lewis, LLP

(57) ABSTRACT

A calibration procedure for correcting two port frequency measurements. Calibration standards are initially connected to port one of a network analyzer and individually measured. This process is repeated with port two of the analyzer. A jumper which is used to bridge ports one and two is then connected to port one. At the far end of the jumper, three references are sequentially connected and the combination of the jumper and the terminations are measured. The raw data measured thus far is then processed to extract the two port electrical parameters of the jumper. The measured jumper is then bridged between ports one and two, and a series of measurements are made. Using the known electrical characteristics of the jumper, an intervening network is completely characterized and the measured $S_M$ and actual $S_A$ parameters of any device to be tested are relayed.

16 Claims, 5 Drawing Sheets

METHOD FOR CALIBRATING TWO PORT HIGH FREQUENCY MEASUREMENTS

BACKGROUND OF THE INVENTION

1. Field of the Invention

The present invention generally relates to the measurement of network parameters with a multiport network analyzer and, more particularly, to a method for calibrating the analyzer for two port high frequency measurements.

2. Description of the Related Art

In designing cables and connecting hardware for use with high frequency signals it is imperative to understand the electrical characteristics of the components used to link a device or cable under-test with the electronics used to transmit and receive data. All of the possible couplings between connectors and cables can be measured with multiport measurement equipment comprising a network analyzer and a switching network. The key to providing an accurate multiport measurement system is a two port calibration procedure which is used repeatedly on every combination of pairs of ports in the measurement system.

Errors associated with network analyzer measurements can result from either non-ideal conditions in the measurement equipment or from the effects of the mechanical fixtures, such as cables and connectors, which are used to connect a device under test (DUT) to the network analyzer or test bed. A simple way to model this error is to view the test bed and the DUT as an ideal network analyzer cascaded with an error network and followed by the DUT. Such a network representation is illustrated in FIG. 1. The intervening network can then be used to account for the effects introduced by internal switching matrices connecting the various analyzer ports to the mechanical fixtures, as well as other sources of loss and distortion within the analyzer. The network can also be used to account for the effects of the fixtures themselves, which effects may introduce loss, crosstalk, and impedance discontinuities. Thus, the ideal network analyzer measures the cascaded network consisting of the intervening linear network followed by the DUT and obtains the measured S-parameters of the composite intervening network and DUT, here denoted as $S_M$. (See FIG. 1).

During testing, the acquired data which is intended to characterize the DUT is oftentimes corrupted by imperfections in the measuring device. The data must therefore be processed to compensate for known errors when extracting the parameters which describe the DUT, here denoted as $S_A$. An algorithm is used to relate the measured parameters $S_M$ to the actual parameters $S_A$. However, because the intervening network in the model is partially internal to the measurement equipment, $S_A$ cannot be evaluated separately. The only way to characterize $S_A$, therefore, is to measure various DUTs with known electrical characteristics and extract the appropriate parameters from $S_M$. This process is further complicated when switching networks are involved because each change in the switch settings of the network analyzer results in a change in the intervening network due to differences in the signal routing. Thus, a different intervening network exists for each switch setting of the Network Analyzer, and each network must therefore be separately evaluated to compensate for measurement errors.

Existing calibration procedures involve very specific error models which do not account for the electrical properties of the jumpers used when the two measurement ports of the network analyzer are bridged as part of the calibration process. Although acceptable for low frequencies measurements, at high frequencies where the electrical length of the fixtures may easily approach a quarter wavelength, this failure introduces substantial errors which will not be corrected by the remaining calibration.

It would therefore be advantageous to provide a method for compensating for the inaccuracies introduced during the performance of two port calibration procedures which is used repeatedly on every combination of pairs of ports in a measurement system.

SUMMARY OF THE INVENTION

The above and other problems are overcome by a method for calibrating two port high frequency measurements which takes into account the electrical properties of jumpers which are used when the measurement ports of a network analyzer are bridged as part of the calibration process.

According to the invention, a method is used to remove systematic errors from two port network analyzer measurements. The method allows an intervening network to be completely arbitrary, and computes and factors the electrical properties of the jumpers which are used to bridge the analyzer ports of the network analyzer into a calibration process. This results in more accurate high frequency data than is possible with traditional calibration methods. This level of precision is essential when significant signal processing is applied to the measured data via software residing on a PC.

The calibration procedure consists of several stages and requires various calibration standards, typically an open circuit termination, a short circuit termination, and a reference load which is usually 50Ω or 75Ω, for example. The calibration standards are first connected to port one and are individually measured. This process is repeated with a port two of the network analyzer. Next, a jumper (for later use in bridging ports one and two of the network analyzer) is connected to port one. At the far end of the jumper, the three reference calibration standards are sequentially connected and the combination of the jumper and a termination is measured. The raw data obtained thus far is then processed to extract the two port electrical parameters of the jumper. The measured jumper is then bridged between ports one and two of the network analyzer and a series of measurements are made. Using the known electrical characteristics of the jumper, the intervening network is completely characterized and the measured $S_M$ and actual parameters $S_A$ of any DUT are related.

BRIEF DESCRIPTION OF THE DRAWINGS

The foregoing and other advantages and features of the invention will become more apparent from the detailed description of the preferred embodiments of the invention given below, with reference to the accompanying drawings in which.

DETAILED DESCRIPTION OF THE PREFERRED EMBODIMENT

Figure 1:
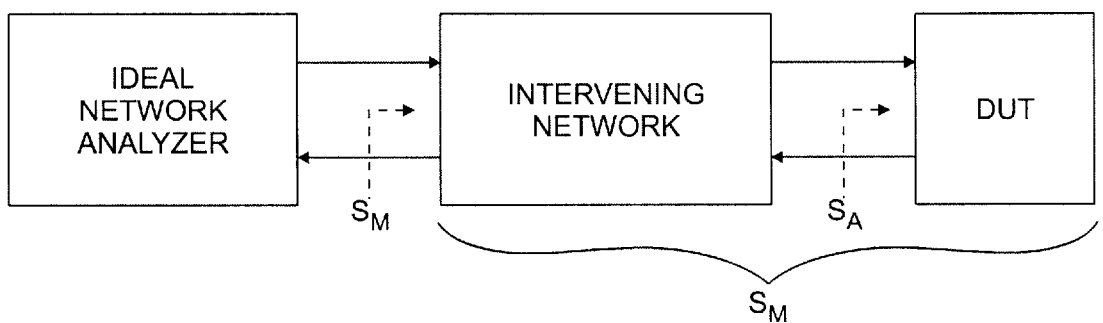
FIG. 1 is an illustration of an error model for network analyzer measurements.
Figure 3:
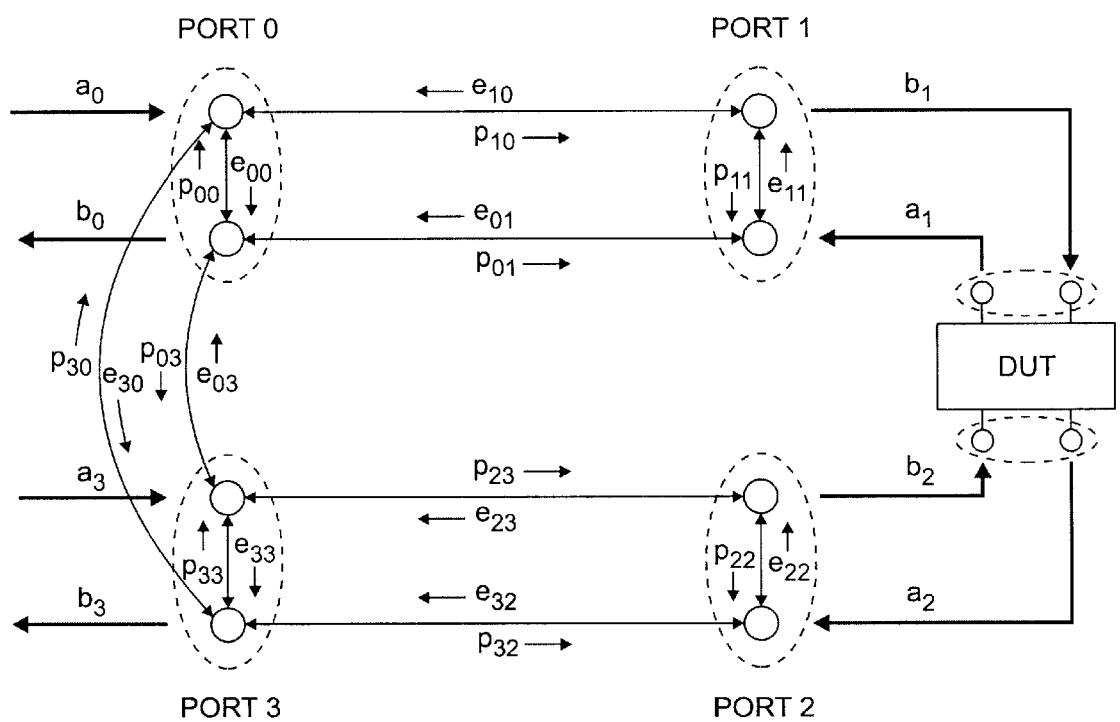
FIG. 3 illustrates a 12 term error model for two port measurements.

FIG. 1 is an illustration of a linear intervening network (primarily switching networks and mechanical fixtures, such as cables and connectors, for example). Typically, a linear intervening network as described corrupts measured data. In such a network, relating the measured data $S_M$ and the actual data $S_A$ for a completely general intervening network is problematic. Due to internal switching, the intervening network may have completely different electrical characteristics for forward measurements ($s_{11}$ and $s_{21}$) and reverse measurements ($s_{22}$ and $s_{12}$). For forward measurements, when the switch is set in one direction, the intervening network is characterized by a completely general 4×4 S-parameter matrix $S_F$ of the form:

$$S_F = \begin{bmatrix} e_{00} & e_{01} & e_{02} & e_{03} \\ e_{10} & e_{11} & e_{12} & e_{13} \\ e_{20} & e_{21} & e_{22} & e_{23} \\ e_{30} & e_{31} & e_{32} & e_{33} \end{bmatrix} \quad \text{(Eq. 1)}$$

where each e in the matrix represents the reflection value obtained when a port of the intervening network is excited by an input signal (see FIG. 3).

With reverse measurements the intervening network is characterized by a completely general S-parameter matrix $S_R$ of the form:

$$S_R = \begin{bmatrix} p_{00} & p_{01} & p_{02} & p_{03} \\ p_{10} & p_{11} & p_{12} & p_{13} \\ p_{20} & p_{21} & p_{22} & p_{23} \\ p_{30} & p_{31} & p_{32} & p_{33} \end{bmatrix} \quad \text{(Eq. 2)}$$

where each p in the matrix represents the reflection value obtained when a port of the intervening network is excited by an input signal.

Figure 2:
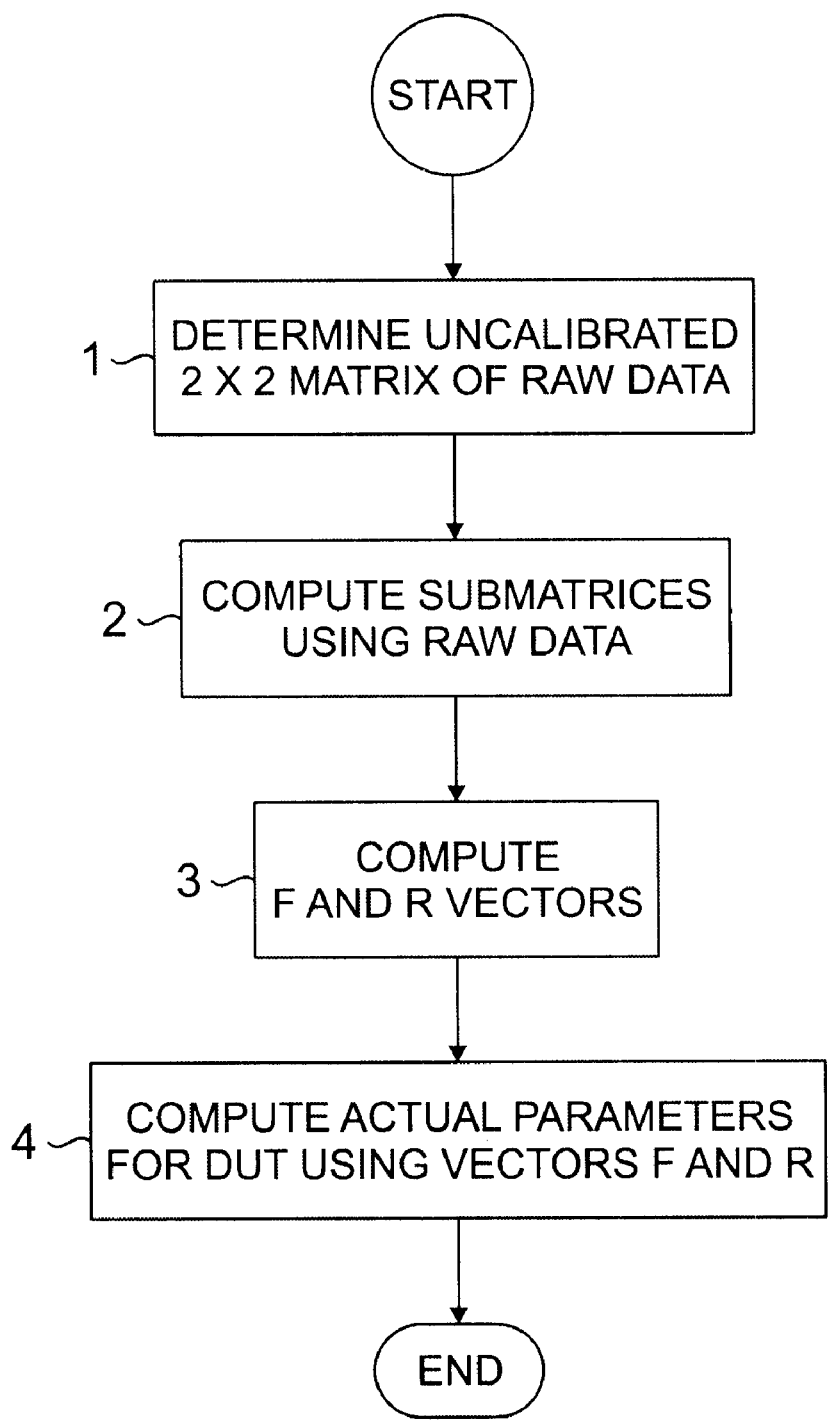
FIG. 2 is a flow chart showing a method for computing the parameters of a general intervening network.

The new method for performing computations for determining the parameters of a general intervening network illustrated in the flow chart shown in FIG. 2 is as follows. First, the uncalibrated 2×2 matrix of measured data for the DUT is obtained (step 1) according to the relationship:

$$S_M = \begin{bmatrix} sm_{11} & sm_{12} \\ sm_{21} & sm_{22} \end{bmatrix} \quad \text{(Eq. 3)}$$
$$= [f \ r],$$

where $f$ and $r$ are 2×1 vectors given by the relationship $$f = \begin{bmatrix} sm_{11} \\ sm_{21} \end{bmatrix} \quad \text{(Eq. 4)}$$

$$r = \begin{bmatrix} sm_{12} \\ sm_{22} \end{bmatrix} \quad \text{(Eq. 5)}$$

and $sm_{11}$, $sm_{21}$, $sm_{12}$, and $sm_{22}$ are the measured input reflection at port 1 of the network analyzer, the measured forward transmission at port 2, the measured reverse transmission at port 2 and the measured output reflection at port 2, respectively.

Next, from the matrixes $S_F$ and $S_R$, the following submatrices and vectors are computed (step 2):

$$A_{11} = \begin{bmatrix} e_{00} & e_{03} \\ e_{30} & e_{33} \end{bmatrix} \quad A_{12} = \begin{bmatrix} e_{01} & e_{02} \\ e_{31} & e_{32} \end{bmatrix} \quad \text{(Eq. 6)}$$

$$A_{21} = \begin{bmatrix} e_{10} & e_{13} \\ e_{20} & e_{23} \end{bmatrix} \quad A_{22} = \begin{bmatrix} e_{11} & e_{12} \\ e_{21} & e_{22} \end{bmatrix}$$

$$B_{11} = \begin{bmatrix} p_{00} & p_{03} \\ p_{30} & p_{33} \end{bmatrix} \quad B_{12} = \begin{bmatrix} p_{01} & p_{02} \\ p_{31} & p_{32} \end{bmatrix}$$

$$B_{21} = \begin{bmatrix} p_{10} & p_{13} \\ p_{20} & p_{23} \end{bmatrix} \quad B_{22} = \begin{bmatrix} p_{11} & p_{12} \\ p_{21} & p_{22} \end{bmatrix}$$

$$\epsilon_1 = \begin{bmatrix} 1 \\ 0 \end{bmatrix}, \epsilon_2 = \begin{bmatrix} 0 \\ 1 \end{bmatrix} \quad \text{(Eq. 7)}$$

where $\epsilon_1$ and $\epsilon_1$ are standard unit vectors.

Next, in step 3, the vectors F and R are computed according to the following relationship where $$F = A_{12}^{-1}(f - A_{11}\epsilon_1) = A_{12}^{-1}\begin{bmatrix} sm_{11} - e_{00} \\ sm_{21} - e_{30} \end{bmatrix} \quad \text{(Eq. 8)}$$

$$R = B_{12}^{-1}(r - B_{11}\epsilon_2) = B_{12}^{-1}\begin{bmatrix} sm_{12} - p_{03} \\ sm_{22} - p_{33} \end{bmatrix}. \quad \text{(Eq. 9)}$$

In step 4, the actual S-parameters for the DUT are computed according to the following relationship, where $$S_A = [F \ R][A_{22}F + A_{21}\epsilon_1 B_{22}R + B_{21}\epsilon_2]^{-1} \quad \text{(Eq. 10)}$$

where F and R represent a composite of processed data for forward and reverse measurements, respectively.

FIG. 3 is an illustration of a 12 term error model for two port measurements. Application of the method for the general intervening network illustrated in FIG. 2 to the network shown in FIG. 3 yields 12 unknown quantities from the intervening network and 4 uncalibrated measurements of the DUT. These 16 quantities completely define all of the information needed to compute the actual S-parameters of the DUT, and are expressed in vector form as:

$$v_s = \begin{bmatrix} e_{00} & e_{30} & e_{10}e_{01} & \dfrac{e_{01}}{e_{32}} & e_{11} & \dfrac{e_{01}e_{22}}{e_{32}} & p_{33} & p_{03} & p_{23}p_{32} & \dfrac{p_{32}}{p_{01}} & p_{22} & \dfrac{p_{11}p_{32}}{p_{01}} & sm_{11} & sm_{21} & sm_{12} & sm_{22} \end{bmatrix}. \quad \text{(Eq. 11)}$$

where $v_s$ is obtained by evaluating the expression in Eq. 10.

Figure 4A:
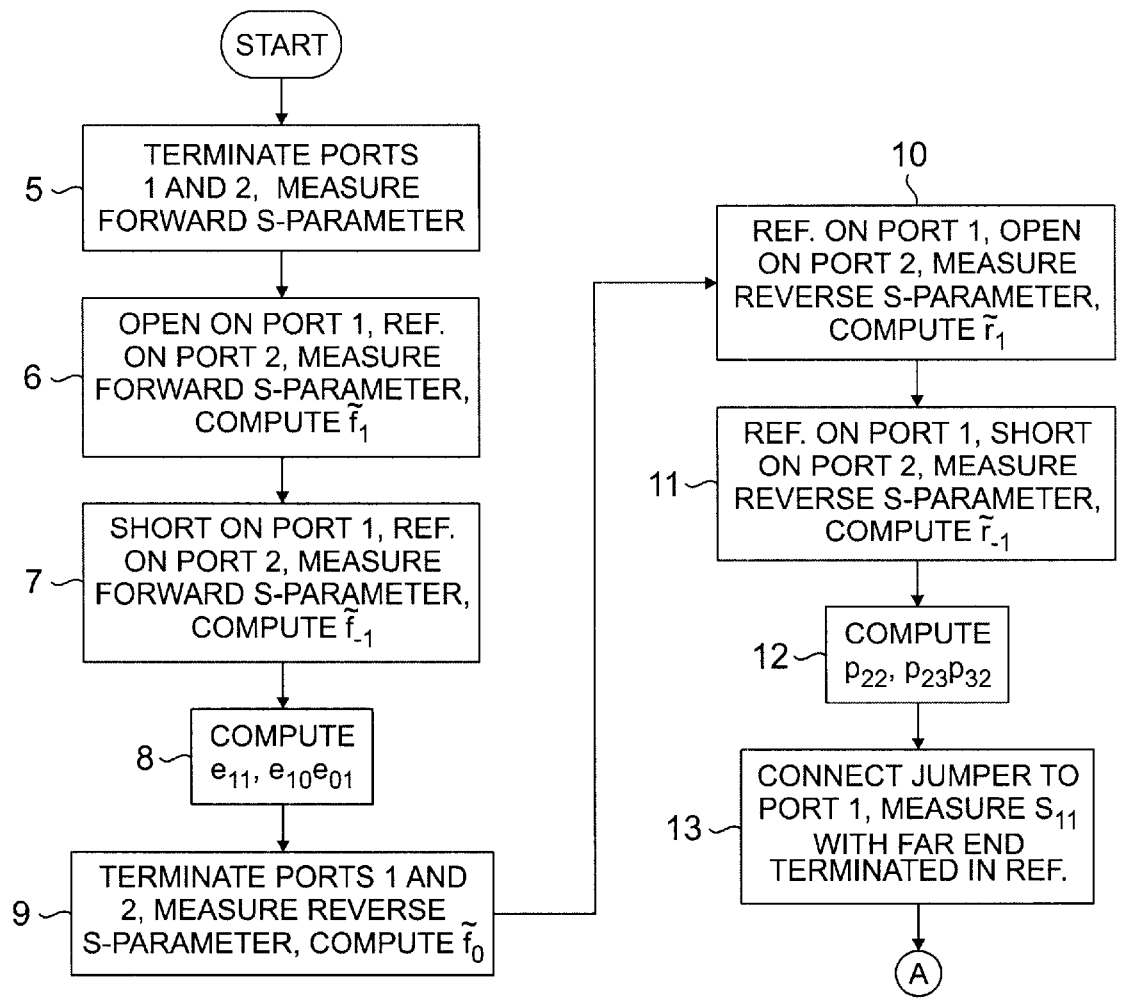
FIGS. 4(a) & 4(b) are a flow chart illustrating the steps for determining $S_F$ and $S_R$ for the 12 term error model.
Figure 4B:
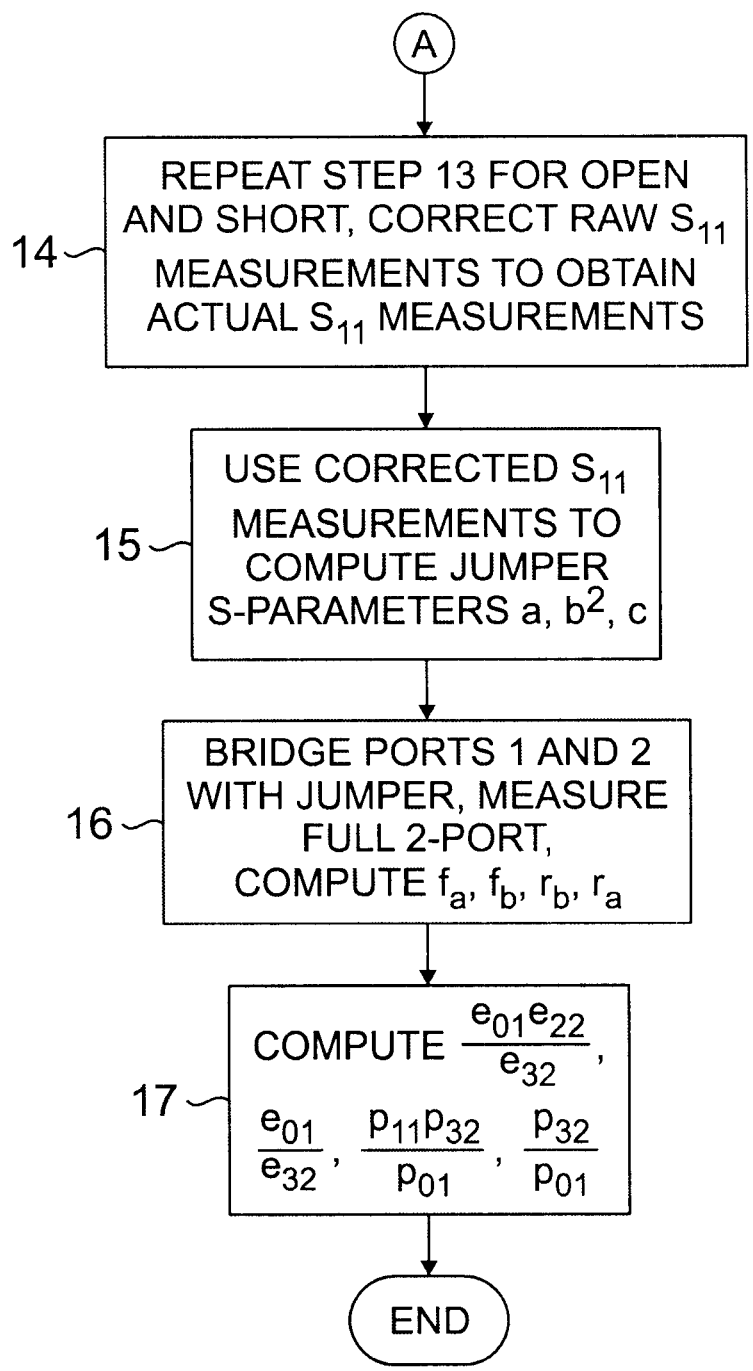

FIG. 4 is a flow chart which illustrates the steps for determinating $S_F$ and $S_R$ for the 12 term error model. To determine the parameters which describe the intervening network, with both measurement ports terminated in the reference impedance, first measure the forward S-parameter vector $f_0$ and determine $e_{00}$, and $e_{30}$ (step 5) according to the relationship:

$$f_0 = \begin{bmatrix} e_{00} \\ e_{30} \end{bmatrix} \quad \text{(Eq. 12)}$$

Next, the reference is kept on port 2 of the network analyzer, an open termination is connected to port 1, the forward S-parameter vector $f_1$ is measured and $\tilde{f}_1$ is computed (step 6) according to the relationship:

$$\tilde{f}_1 = f_1 - f_0 = \begin{bmatrix} f_p \\ 0 \end{bmatrix} \quad \text{(Eq. 13)}$$

In step 7, the reference is kept on port 2 of the network analyzer, a short termination is connected to port 1, the forward S-parameter vector $f_{-1}$ is measured and $\tilde{f}_{-1}$ is computed according to the relationship $$\tilde{f}_{-1} = f_{-1} - f_0 = \begin{bmatrix} f_n \\ 0 \end{bmatrix} \quad \text{(Eq. 14)}$$

where $f_1$ represents the data which is obtained when an open termination is connected to port 1 and the reference is connected to port 2, $f_0$ represents the data which is obtained when the a reference termination is connected to port 1 and a reference is connected to port 2, and $f_{-1}$ represents the data which is obtained when a short termination is connected to port 1 and the reference is connected to port 2.

Next the parameters $e_{11}$ and $e_{10}e_{01}$ are computed (step 8) according to the relationships:

$$e_{11} = \frac{f_p + f_n}{f_p - f_n} \quad \text{(Eq. 15)}$$

$$e_{10}e_{01} = 2\frac{f_p f_n}{(f_n - f_p)}. \quad \text{(Eq. 16)}$$

Here, although the two port calculation is incomplete, enough information has been determined to completely correct so measurements. Denoting the raw measured $s_{11}$ parameters as $\Gamma_{raw}$, the following relationship can be used to express the actual value $\Gamma_{actual}$ as $$\Gamma_{actual} = \frac{\Gamma_{raw} - e_{00}}{e_{11}\Gamma_{raw} + e_{10}e_{01} - e_{00}e_{11}}. \quad \text{(Eq. 17)}$$

Next, with both measurement ports of the network analyzer terminated in the reference impedance, the reverse S-parameter vector $r_0$ is measured and $p_{33}$ and $p_{03}$ are determined (step 9) in accordance with the relationship:

$$r_0 = \begin{bmatrix} p_{03} \\ p_{33} \end{bmatrix}. \quad \text{(Eq. 18)}$$

Next, with the reference still connected to port 1 of the network analyzer, an open termination is connected to port 2, the reverse S-parameter vector $r_1$, is measured and $\tilde{r}_1$ is computed (Step 10) according to the relationship:

$$\tilde{r}_1 = r_1 - r_0 = \begin{bmatrix} 0 \\ r_p \end{bmatrix}. \quad \text{(Eq. 19)}$$

While leaving the reference on port 1, a short termination is connected to port 2 of the network analyzer, the reverse S-parameter vector $r_{-1}$ is measured and $\tilde{r}_{-1}$ is computed (step 11) according to the relationship:.

$$\tilde{r}_{-1} = r_{-1} - r_0 = \begin{bmatrix} 0 \\ r_n \end{bmatrix}. \quad \text{(Eq. 20)}$$

where $r_1$ represents the data which is obtained when an open termination is connected to port 2 and the reference is connected to port 1, $r_0$ represents the data which is obtained when a reference termination is connected to port 2 and a reference is connected to port 1, and $r_-$ represents the data which is obtained when a short termination is connected to port 2 and the reference is connected to port 1.

Next, the parameters $p_{22}$ and $p_{23}p_{32}$ are computed (Step 12) according to the following relationships:

$$p_{22} = \frac{r_p + r_n}{r_p - r_n} \quad \text{(Eq. 21)}$$

$$p_{23}p_{32} = 2\frac{r_p r_n}{(r_n - r_p)} \quad \text{(Eq. 22)}$$

Next, a semi-rigid coaxial cable is connected to port one of the network analyzer; port 2 is terminated in a reference. One port measurements, $s_{11}$ are made (step 13) on the coax to determine its 2 port S-parameter matrix having the form:

$$s_{coax} = \begin{bmatrix} a & b \\ b & c \end{bmatrix}. \quad \text{(Eq. 23)}$$

A reference is then connected to the far end of the coax and the $s_{11}$ parameter is measured. With the procedure described in step 4, the raw data is then corrected in order to determine the actual $s_{11}$ parameter of the coax when terminated in the reference $\Gamma_r$. Step 13 is then repeated to obtain the corrected s, parameter of the coax terminated in an open circuit $\Gamma_0$ and the corrected $s_{11}$ parameter of the coax terminated in a short $\Gamma_s$ (step 14). The coax parameters a, b, c are determined (step 15) according to the relationships:

$$a = \Gamma_r \quad \text{(Eq. 24)}$$

$$b^2 = 2\frac{(\Gamma_r - \Gamma_s)(\Gamma_o - \Gamma_r)}{(\Gamma_o - \Gamma_s)} \quad \text{(Eq. 25)}$$

$$c = \frac{\Gamma_o + \Gamma_s - 2\Gamma_r}{\Gamma_o - \Gamma_s} \quad \text{(Eq. 26)}$$

where a is the amount of signal which is reflected from the coax cable, b is the amount of signal which is passed through the cable, and c is amount of signal which is reflected when the measurement process is reversed.

Next, the coax is connected between ports 1 and 2 of the network analyzer and a full two port measurement is performed, which yields a 2×2 matrix of $S_{raw}$ data defined as STOW, and the following matrix is computed (step 16) according to the relationship:

$$\begin{bmatrix} f_a & r_b \\ f_b & r_a \end{bmatrix} = S_{raw} - \begin{bmatrix} e_{00} & p_{03} \\ e_{30} & p_{33} \end{bmatrix} \quad \text{(Eq. 27)}$$

Finally, the remaining parameters necessary to complete the two port calibration are computed (step 17) according to the relationships:

$$\frac{e_{01}e_{22}}{e_{32}} = \frac{(1-ae_{11})f_a - ae_{10}e_{01}}{bf_b} \quad \text{(Eq. 28)}$$

$$\frac{e_{01}}{e_{32}} = \frac{(b^2-ac)(e_{11}f_a + e_{10}e_{01}) + cf_a}{bf_b} \quad \text{(Eq. 29)}$$

$$\frac{p_{11}p_{32}}{p_{01}} = \frac{(1-cp_{22})r_a - cp_{23}p_{32}}{br_b}$$

$$\frac{p_{32}}{p_{01}} = \frac{(b^2-ac)(r_a p_{22} + p_{23}p_{32}) + ar_a}{br_b}. \quad \text{(Eq. 30)}$$

Once all of the electrical characteristics are determined using the method according to the invention, the intervening network can be completely characterized. Using the method, the electrical properties of jumpers which are used to bridge the analyzer ports of the network analyzer are computed and factored into the calibration process. In this manner, systematic errors from two port network analyzer measurements can be removed via processing on a PC.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A method of performing measurements for a device under test, the measurements being performed utilizing a measurement device having at least first and second ports adapted for coupling to corresponding ports of the device under test, the method comprising the steps of:

measuring first S-parameter data at the first and second ports of the measurement device using at least a subset of a set of one-port standards;

measuring, with a first port of an interconnect element coupled to one of the first and second ports of the measurement device, second S-parameter data at a second port of the interconnect element using at least a subset of the set of one-port standards;

measuring third S-parameter data with the first and second ports of the measurement device connected together using the interconnect element;

processing the first, second and third S-parameter data to generate calibration information for use in correcting subsequent measured S-parameter data generated by the measurement device when coupled to the device under test.

2. The method of claim 1 wherein the measurement device comprises a network analyzer.

3. The method of claim 1 wherein the interconnect element comprises a two-port network.

4. The method of claim 3 wherein the two-port network comprises a jumper cable.

5. The method of claim 4 wherein the jumper cable comprises a semi-rigid coaxial cable.

6. The method of claim 1 wherein the interconnect element has one or more unknown transmission or reflection characteristics.

7. The method of claim 1 wherein the set of one-port standards comprises a short circuit termination, an open circuit termination and a reference load termination.

8. The method of claim 1 further including the step of utilizing the calibration information to convert measured S-parameter data $S_M$ for the device under test to actual S-parameter data $S_A$ for the device under test.

9. The method of claim 8 wherein the actual S-parameter data $S_A$ for the device under test is determined from the measured S-parameter data $S_M$ in accordance with the following relationship:

$$S_A = [F\ R][A_{22}F + A_{21}\epsilon_1 B_{22}R + B_{21}\epsilon_2]^{-1},$$

wherein $\epsilon_1$ and $\epsilon_2$ are standard unit vectors, $$F = A_{12}^{-1}\begin{bmatrix} sm_{11} & -e_{00} \\ sm_{21} & -e_{30} \end{bmatrix},$$

$$R = B_{12}^{-1}\begin{bmatrix} sm_{12} & -p_{03} \\ sm_{22} & -p_{33} \end{bmatrix}, A_{12} = \begin{bmatrix} e_{01} & e_{02} \\ e_{31} & e_{32} \end{bmatrix},$$

$$A_{21} = \begin{bmatrix} e_{10} & e_{13} \\ e_{20} & e_{23} \end{bmatrix}, A_{22} = \begin{bmatrix} e_{11} & e_{12} \\ e_{21} & e_{22} \end{bmatrix}, B_{12} = \begin{bmatrix} p_{01} & p_{02} \\ p_{31} & p_{32} \end{bmatrix},$$

$$B_{21} = \begin{bmatrix} p_{10} & p_{13} \\ p_{20} & p_{23} \end{bmatrix} \text{ and } B_{22} = \begin{bmatrix} p_{11} & p_{12} \\ p_{21} & p_{22} \end{bmatrix},$$

and further wherein $sm_{xx}$ comprise elements of the measured S-parameter data $S_M$, and $e_{xx}$ and $p_{xx}$ comprise elements of respective 4×4 forward and reverse S-parameters matrices $S_F$ and $S_R$ generatable from at least a portion of the first, second and third S-parameter data.

10. An apparatus for performing measurements on a device under test, the apparatus comprising:

a measurement device having at least first and second ports adapted for coupling to corresponding ports of the device under test, the measurement device being operative: (i) to measure first S-parameter data at the first and second ports of the measurement device using at least a subset of a set of one-port standards; (ii) to measure, with a first port of an interconnect element coupled to one of the first and second ports of the measurement device, second S-parameter data at a second port of the interconnect element using at least a subset of the set of one-port standards; and (iii) to measure third S-parameter data with the first and second ports of the measurement device connected together using the interconnect element;

wherein the first, second and third S-parameter data are processed to generate calibration information for use in correcting subsequent measured S-parameter data generated by the measurement device when coupled to the device under test.

11. The apparatus of claim 10 wherein the measurement device comprises a network analyzer.

12. The apparatus of claim 10 wherein the measurement device is further operative utilize the calibration information to convert measured S-parameter data $S_M$ for the device under test to actual S-parameter data $S_A$ for the device under test.

13. The apparatus of claim 12 wherein the actual S-parameter data $S_A$ for the device under test is determined from the measured S-parameter data $S_M$ in accordance with the following relationship:

$$S_A = [F\ R][A_{22}F + A_{21}\epsilon_1 B_{22}R + B_{21}\epsilon_2]^{-1},$$

wherein $\epsilon_1$ and $\epsilon_2$ are standard unit vectors, $$F = A_{12}^{-1}\begin{bmatrix} sm_{11} & -e_{00} \\ sm_{21} & -e_{30} \end{bmatrix},$$

$$R = B_{12}^{-1}\begin{bmatrix} sm_{12} & -p_{03} \\ sm_{22} & -p_{33} \end{bmatrix}, A_{12} = \begin{bmatrix} e_{01} & e_{02} \\ e_{31} & e_{32} \end{bmatrix},$$

$$A_{21} = \begin{bmatrix} e_{10} & e_{13} \\ e_{20} & e_{23} \end{bmatrix}, A_{22} = \begin{bmatrix} e_{11} & e_{12} \\ e_{21} & e_{22} \end{bmatrix}, B_{12} = \begin{bmatrix} p_{01} & p_{02} \\ p_{31} & p_{32} \end{bmatrix},$$

$$B_{21} = \begin{bmatrix} p_{10} & p_{13} \\ p_{20} & p_{23} \end{bmatrix} \text{ and } B_{22} = \begin{bmatrix} p_{11} & p_{12} \\ p_{21} & p_{22} \end{bmatrix},$$

and further wherein $sm_{xx}$ comprise elements of the measured S-parameter data $S_M$, and $e_{xx}$ and $p_{xx}$ comprise elements of respective 4×4 forward and reverse S-parameters matrices $S_F$ and $S_R$ generatable from at least a portion of the first, second and third S-parameter data.

14. An article of manufacture comprising a machine-readable storage medium storing one or more software programs for use in performing measurements for a device under test, the measurements being performed utilizing a measurement device having at least first and second ports adapted for coupling to corresponding ports of the device under test, wherein the one or more software programs when executed implement the steps of:
  measuring first S-parameter data at the first and second ports of the measurement device using at least a subset of a set of one-port standards;
  measuring, with a first port of an interconnect element coupled to one of the first and second ports of the measurement device, second S-parameter data at a second port of the interconnect element using at least a subset of the set of one-port standards;
  measuring third S-parameter data with the first and second ports of the measurement device connected together using the interconnect element; and
  processing the first, second and third S-parameter data to generate calibration information for use in correcting subsequent measured S-parameter data generated by the measurement device when coupled to the device under test.

15. The storage medium of claim 14 wherein the one or more programs are further operative to utilize the calibration information to convert measured S-parameter data $S_M$ for the device under test to actual S-parameter data $S_A$ for the device under test.

16. The storage medium of claim 15 wherein the actual S-parameter data $S_A$ for the device under test is determined from the measured S-parameter data $S_M$ in accordance with the following relationship:

$$S_A = [F\ R][A_{22}F + A_{21}\epsilon_1 B_{22}R + B_{21}\epsilon_2]^{-1},$$

wherein $\epsilon_1$ and $\epsilon_2$ are standard unit vectors, $$F = A_{12}^{-1}\begin{bmatrix} sm_{11} & -e_{00} \\ sm_{21} & -e_{30} \end{bmatrix},$$

$$R = B_{12}^{-1}\begin{bmatrix} sm_{12} & -p_{03} \\ sm_{22} & -p_{33} \end{bmatrix}, A_{12} = \begin{bmatrix} e_{01} & e_{02} \\ e_{31} & e_{32} \end{bmatrix},$$

$$A_{21} = \begin{bmatrix} e_{10} & e_{13} \\ e_{20} & e_{23} \end{bmatrix}, A_{22} = \begin{bmatrix} e_{11} & e_{12} \\ e_{21} & e_{22} \end{bmatrix}, B_{12} = \begin{bmatrix} p_{01} & p_{02} \\ p_{31} & p_{32} \end{bmatrix},$$

$$B_{21} = \begin{bmatrix} p_{10} & p_{13} \\ p_{20} & p_{23} \end{bmatrix} \text{ and } B_{22} = \begin{bmatrix} p_{11} & p_{12} \\ p_{21} & p_{22} \end{bmatrix},$$

and further wherein $sm_{xx}$ comprise elements of the measured S-parameter data $S_M$, and $e_{xx}$ and $p_{xx}$ comprise elements of respective 4×4 forward and reverse S-parameters matrices $S_F$ and $S_R$ generatable from at least a portion of the first, second and third S-parameter data.

\* \* \* \* \*